(12) United States Patent
Kim

(10) Patent No.: US 8,278,130 B2
(45) Date of Patent: Oct. 2, 2012

(54) BACK SIDE ILLUMINATION IMAGE SENSOR AND METHOD FOR MANUFACTURING THE SAME

(75) Inventor: Mun Hwan Kim, Chungbuk (KR)

(73) Assignee: Dongbu Hitek Co., Ltd., Seoul (KR)

( * ) Notice: Subject to any disclaimer, the term of this patent is extended or adjusted under 35 U.S.C. 154(b) by 270 days.

(21) Appl. No.: 12/640,822

(22) Filed: Dec. 17, 2009

(65) Prior Publication Data

US 2010/0164035 A1 Jul. 1, 2010

(30) Foreign Application Priority Data

Dec. 29, 2008 (KR) ........................ 10-2008-0135592

(51) Int. Cl.
*H01L 21/00* (2006.01)
*H01L 31/00* (2006.01)

(52) U.S. Cl. ........................... 438/59; 257/432; 257/460

(58) Field of Classification Search ................... 257/432, 257/460; 438/59
See application file for complete search history.

(56) References Cited

U.S. PATENT DOCUMENTS

| 7,582,502 B1 * | 9/2009 | Hwang et al. ................ 438/59 |
| 2006/0180885 A1 * | 8/2006 | Rhodes .......................... 257/432 |
| 2008/0173963 A1 * | 7/2008 | Hsu et al. ...................... 257/431 |

* cited by examiner

*Primary Examiner* — Ha Tran T Nguyen
*Assistant Examiner* — Aaron Dehne
(74) *Attorney, Agent, or Firm* — Saliwanchik, Lloyd & Eisenschenk

(57) ABSTRACT

A back side illumination image sensor according to an embodiment includes: a device isolation region and a pixel region that are on a front side of a first substrate; a light sensor and a readout circuit that are on the pixel region; an interlayer dielectric layer and a metal line that are on the front side of the first substrate; a second substrate that is bonded to the front side of the first substrate on which the metal line is formed; a pixel isolating dielectric layer that is on the device isolation region at a back side of the first substrate; and a microlens that is on the light sensor at the back side of the first substrate.

20 Claims, 8 Drawing Sheets

BACK SIDE ILLUMINATION IMAGE SENSOR AND METHOD FOR MANUFACTURING THE SAME

CROSS-REFERENCE TO RELATED APPLICATION

This application claims the benefit under 35 U.S.C. §119 of Korean Patent Application No. 10-2008-0135592, filed Dec. 29, 2008, which is hereby incorporated by reference in its entirety.

BACKGROUND

The present disclosure relates to a back side illumination image sensor.

Image sensors are semiconductor devices that convert optical images into electric signals and are generally classified as a CCD (Charge Coupled Device) image sensor or a CMOS image sensor (CIS).

In a related art CIS, a photodiode is disposed on a substrate by an ion implantation process. As the size of the photodiode gradually decreases to increase the number of pixels without increasing the chip size, there is growing tendency that image quality is reduced due to reduction of the area of an illumination part.

Further, since the stack height is not reduced as much as the reduction of the area of the illumination part, there is tendency that the number of photons entering the illumination part is reduced by the diffraction of light, which is called "airy disk".

In order to solve the above problem, there is provided a back side illumination image sensor, which receives light through a wafer back side to minimize the step at the upper portion of the illumination part and remove interference of light due to metal routing.

FIG. 1 is a cross-sectional diagram illustrating a back side illumination image sensor according to a related art.

In the back side illumination image sensor according to the related art, an illumination device and interconnection are formed on the front side of a substrate and then a back grinding for removing the back side of the substrate to a predetermined thickness is performed. This back grinding process is for fitting the gap between an external module and an optical lens to an appropriate thickness.

However, in the back side illumination sensor according to the related art, an SOI (Silicon On Insulator) wafer is used as the donor wafer where an illumination device and a circuit part are disposed, and then the SOI wafer is bonded to a handle wafer. Thereafter, a back side thinning process is applied to the donor wafer.

The backside thinning process that is applied to the donor wafer according to the relate art is as follows.

First, the backside grinding process is applied to the donor wafer such that several tens of μm remains on the upper portion of a BOX (Buried Oxide) layer of the SOI wafer. Thereafter, the backside thinning process is completed by performing an etch-back.

However, according to the related art, since an expensive SOI wafer is used for the donor wafer, the cost for manufacturing process increases.

Further, according to the related art, as shown in FIG. 1, wafer edge thinning may be generated by the backside grinding process of the donor wafer. Accordingly, a fail may occur in the chip at the wafer edge in the etch-back process performed after the back grinding process, resulting in a problem that economical efficiency is considerably deteriorated.

Further, according to the related art, the wafer center is also exposed to plasma damage in the etch-back process of several tens of μm, such that there is a problem that sensor performance may be deteriorated.

In addition, according to the related art, a device isolation region is only on a surface of the substrate on which the photodiode is formed, thereby causing a cross-talk phenomenon.

Meanwhile, according to the related art, in an image sensor (hereafter, referred to as a "3D-image sensor), a photodiode may be deposited by using amorphous silicon. Otherwise, a readout circuit is formed on a silicon substrate, a photodiode is formed on another wafer, and then the photodiode is disposed over the readout circuit by wafer-to-wafer bonding. The photodiode and the readout circuit are connected by a metal line.

However, according to the 3D-image sensor of the related art, the wafer-to-wafer bonding is performed with respect to the wafer having the readout circuit and the wafer having the photodiode. Here, it is difficult to completely electrically connect the readout circuit with the photodiode due to a problem relating to bonding. For example, according to the related art, a metal line is on the readout circuit and wafer-to-wafer bonding is performed such that the metal line contacts with the photodiode, but the metal line may not completely contact with the photodiode, which makes it difficult to implement an ohmic contact between the metal line and the photodiode Further, according to the related art, a short may occur in the metal line that is electrically connected with the photodiode. Accordingly, researches for preventing the short have been conducted, but the process becomes complicated.

BRIEF SUMMARY

Embodiments provide a back side illumination image sensor that makes it possible to stably and efficiently remove the back side of the substrate for the back side illumination image sensor and a method of manufacturing the back side illumination image sensor.

Further, embodiments provide a back side illumination image sensor that makes it possible to inhibit a cross-talk phenomenon, and a method of manufacturing the back side illumination image sensor.

In addition, embodiments provide a back side illumination image sensor that makes it possible to considerably reduce the manufacturing cost and a method of manufacturing the back side illumination image sensor.

Further, embodiments provide a back side illumination image sensor that makes it possible to maximize the amount of incident light by minimizing the stack on an illumination part while disposing a light sensor and a readout circuit on the same substrate, and inhibit interference and reflection of light due to metal routing, and a method of manufacturing the back side illumination image sensor.

A back side illumination image sensor according to an embodiment includes: a device isolation region and a pixel region on a front side of a first substrate; a light sensor and a readout circuit on the pixel region; an interlayer dielectric layer and a metal line on the front side of the first substrate; a second substrate that is bonded to the front side of the first substrate formed with the metal line; a pixel isolating dielectric layer on the device isolation region at a back side of the first substrate; and a microlens on the light sensor at the back side of the first substrate.

A method of manufacturing a back side illumination image sensor according to an embodiment includes: forming an ion implantation layer by implanting ions throughout a front side of a first substrate; defining a pixel region by forming a device isolation region on the front side of the first substrate; forming a light sensor and a readout circuit on the pixel region; forming an interlayer dielectric layer and a metal line on the front side of the first substrate; bonding a second substrate with the front side of the first substrate formed with the metal line; removing a lower part of the first substrate based on the ion implantation layer; forming a pixel isolating dielectric layer on the device isolating region at a back side of the first substrate; and forming a microlens on the light sensor at the back side of the first substrate.

Further, a method of manufacturing a back side illumination image sensor according to an embodiment includes: defining a pixel region by forming a device isolation region on the front side of a first substrate; forming an ion implantation layer by implanting ions throughout the front side of a first substrate; forming a light sensor and a readout circuit on the pixel region; forming an interlayer dielectric layer and a metal line on the front side of the first substrate; bonding a second substrate with the front side of the first substrate formed with the metal line; removing a lower part of the first substrate based on the ion implantation layer; forming a pixel isolating dielectric layer on the device isolation region at a back side of the first substrate; and forming a microlens on the light sensor at the back side of the first substrate.

DETAILED DESCRIPTION

Hereinafter, embodiments of a back side illumination image sensor and a method of manufacturing the back side illumination image sensor will be described with reference to the accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, or one or more intervening layers may also be present. In addition, it will also be understood that when a layer is referred to as being 'between' two layers, it can be the only layer between the two layers, or one or more intervening layers may also be present.
(Embodiment)

Figure 1:
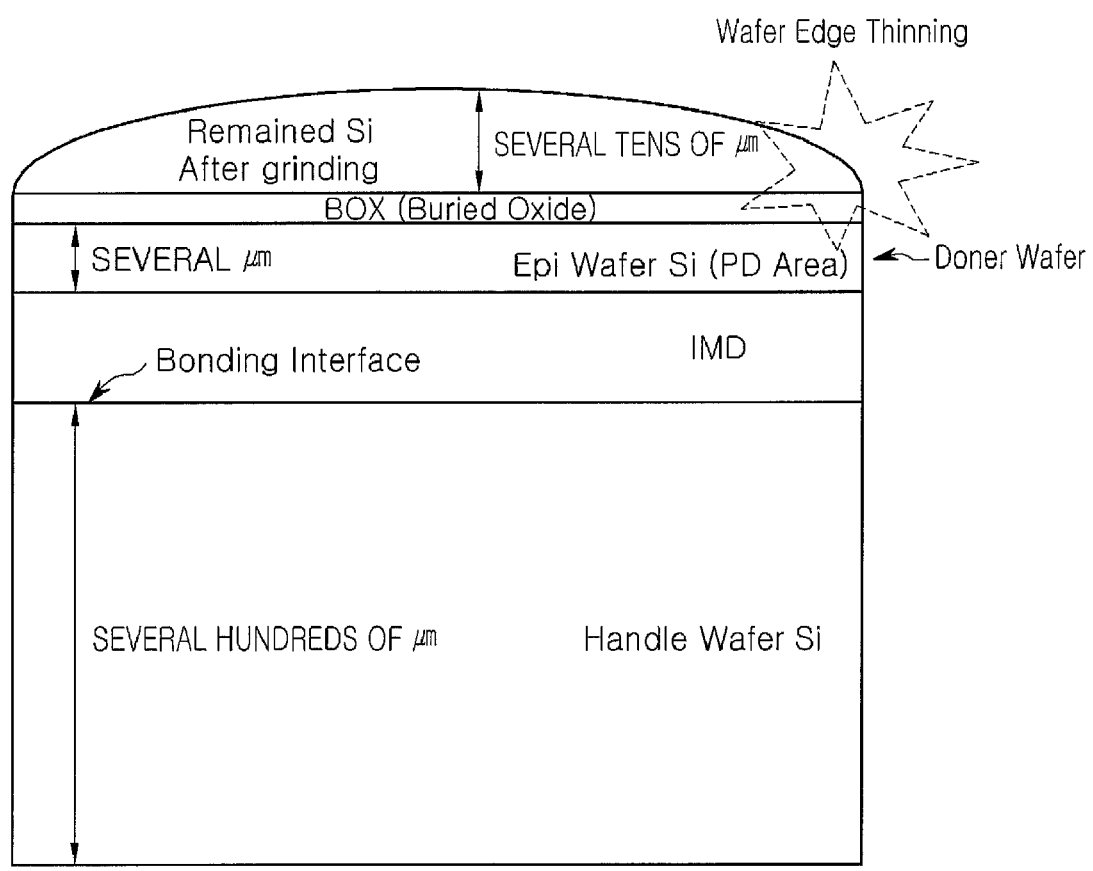
FIG. 1 is a cross-sectional diagram illustrating a back side illumination image sensor according to the related art.
Figure 2:
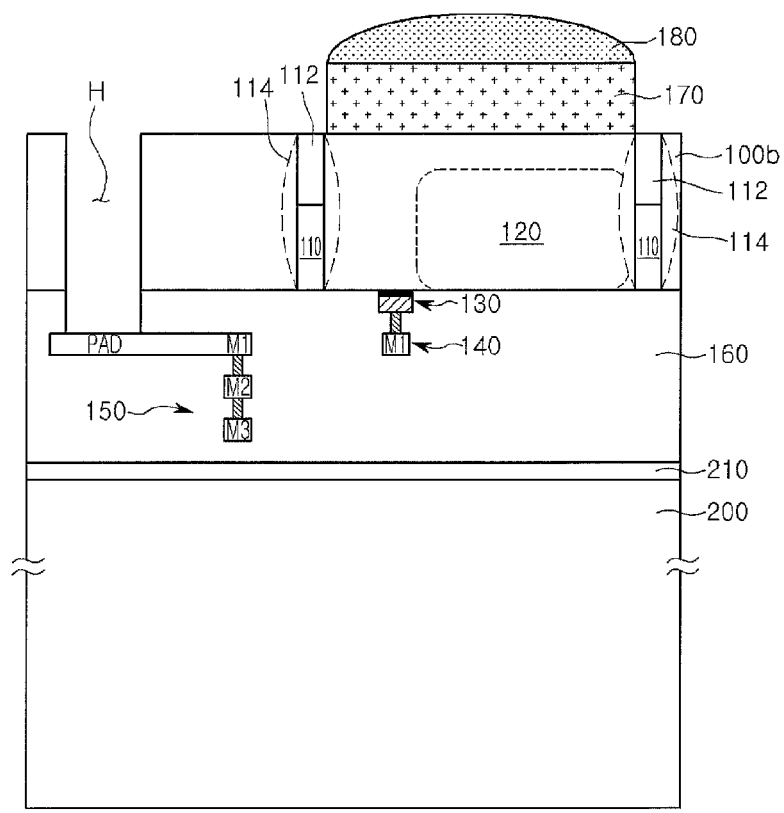
FIG. 2 is a cross-sectional view illustrating a back side illumination image sensor according to an embodiment.

FIG. 2 is a cross-sectional view illustrating a back side illumination image sensor according to an embodiment.

A back side illumination image sensor according to an embodiment includes: a device isolation region 110 and a pixel region that are on a front side of a first substrate; a light sensor 120 and a readout circuit 130 that are in the pixel region; an interlayer dielectric layer 160 and a metal line 140 that are on the front side of the first substrate 100; a second substrate 200 that is bonded to the front side of the first substrate 100 on which the metal line 140 is formed; a pixel isolating dielectric layer 112 that is on the device isolation region 110 at a back side of the first substrate 100; and a microlens 180 that is on the light sensor 120 at the back side of the first substrate.

In a further embodiment, pixel isolating ion implantation layers 114 can be formed around sides of the pixel isolating dielectric layer 112 and the device isolation region 110.

According to the back side illumination image sensor and the method of manufacturing a back side illumination image sensor of an embodiment, it is possible to stably and efficiently remove the back side of the substrate using an ion implantation technology. That is, according to an embodiment, grinding and etch-back are not needed by using the ion implantation and cleaving, resulting in an advantage of not generating problems of the related art, such as an edge die fail and plasma damage.

In addition, according to an embodiment, the pixel isolating dielectric layer is on the device isolation region at the back side of the substrate and the pixel isolating ion implantation layers are on sides of the pixel isolating dielectric layer and/or the device isolation region to better inhibit the inter-pixel cross-talk, thereby making it possible to improve image characteristics.

In other words, according to an embodiment, the pixel isolating dielectric layer is formed on the back side of the substrate by an Si etching to physically isolate between the light sensors of adjacent pixels and P-type pixel isolating ion implantation layers are then formed around sides of the pixel isolating dielectric layer and/or the device isolation region, thereby making it possible to effectively inhibit cross-talk.

Moreover, according to an embodiment, defects, which can occur due to the Si etch damage caused by forming the pixel isolating dielectric layer, can be isolated using the P-type dopant of the pixel isolating ion implantation layer, thereby making it possible to inhibit cross-talk.

Further, an embodiment uses the fact that hard masks used to form the pixel isolating dielectric layer are self-aligned and can be used when the ion implantation process for forming the pixel isolating ion implantation layer is applied, thereby making it possible to apply the pixel isolating ion implantation layer without an additional mask process.

Hereinafter, a method of manufacturing a back side illumination image sensor according to an embodiment of the present invention will be described with reference to FIGS. 3 to 9.

Figure 3A:
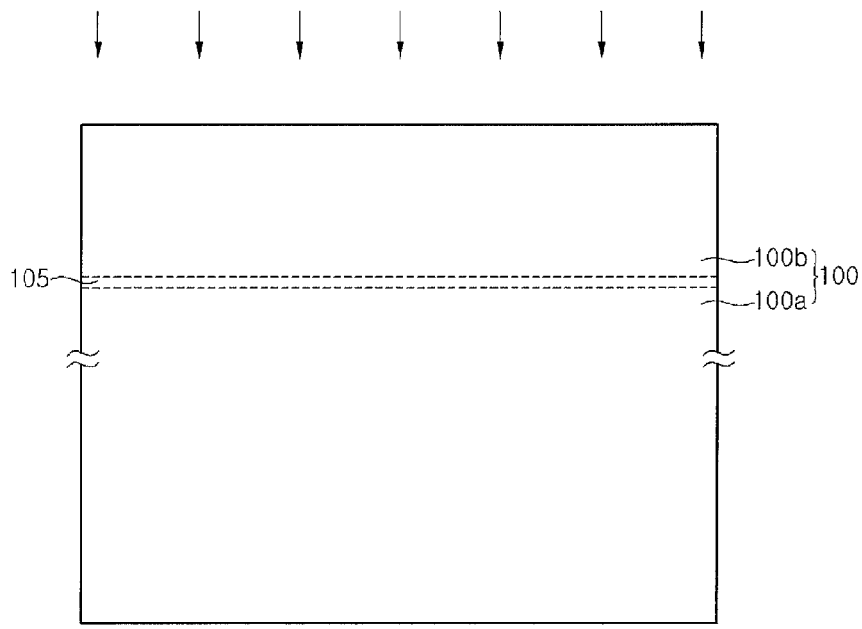
FIGS. 3 to 9 are process cross-sectional diagrams illustrating a method of manufacturing a back side illumination image sensor according to an embodiment.
Figure 3B:
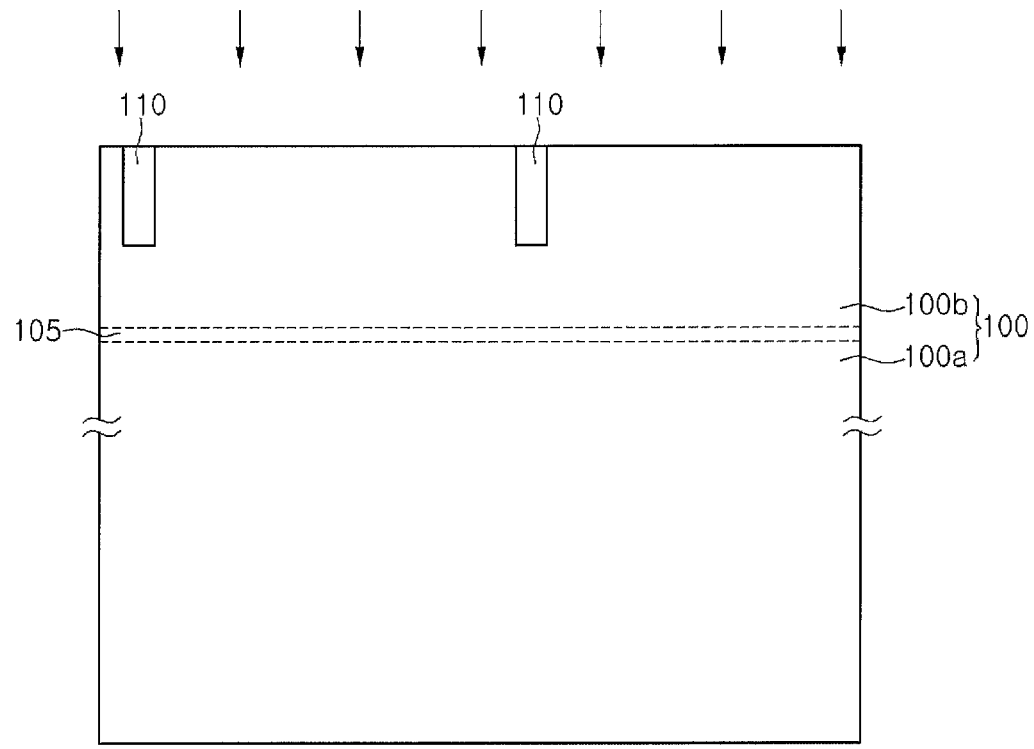
Figure 3C:
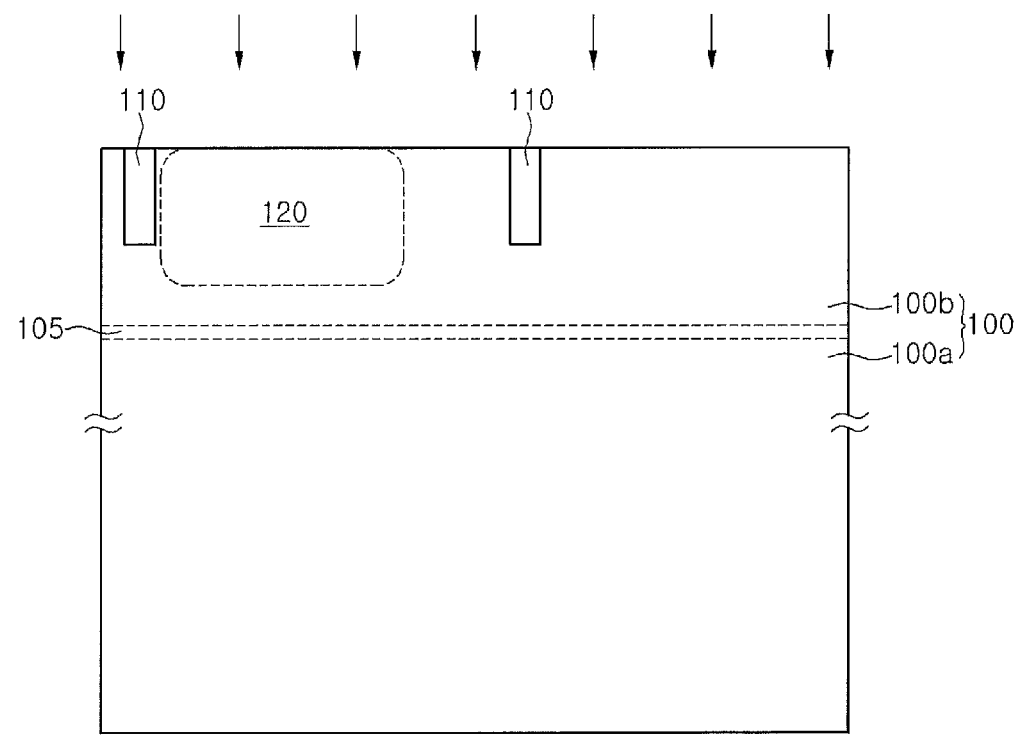

FIGS. 3A to 3C show examples of forming an ion implantation layer 105 according to certain embodiments.

First, as shown in FIG. 3A, an ion implantation layer 105 may be formed on the front side of the first substrate 100. The first substrate 100 may be an epi wafer, but is not limited thereto. The first substrate 100 can be divided into a lower part 100a of the first substrate and an upper part 100b of the first substrate by the ion implantation layer 105.

In a method of manufacturing a back side illumination image sensor according to an embodiment, an epi wafer can be used as the donor wafer (first substrate 100). According to the embodiment, using the epi wafer can considerably reduce the manufacturing cost as compared with using an SOI wafer.

Further, according to an embodiment, the epi wafer can be used as the donor wafer and the light sensor and the circuit device can be formed together on the epi wafer. Therefore, by not performing the bonding process of a 3D-image sensor that forms a photodiode over a circuit, the manufacturing process is facilitated and problems relating to bonding and contacting are removed.

The ion implantation layer 105 may be provided by performing ion implantation to the front side of the first substrate 100. It is preferable to perform ion implantation through the front side, because the back side of the first substrate 100 is a few hundred μm.

That is, since the thickness of the first substrate 100 is very large relative to the depth of the ion implantation, it is difficult to perform ion implantation through the back side of the first substrate 100. Therefore, according to an embodiment, the ion implantation layer 105 is formed in the first substrate 100 before the process of forming the metal line 140 or bonding with the second substrate 200 so that it is possible to easily remove the lower part 100a of the first substrate after bonding.

The process of forming the ion implantation layer 105 can be performed by implanting ions, such as hydrogen (H) or helium (He), but it is not limited thereto.

In another embodiment as shown in FIG. 3B, it is possible to form the ion implantation layer 105 after forming a device isolation region on the front side of the first substrate. For example, a pixel region is defined by forming the device isolation region 110 on the front side of the first substrate 100. Then, the ion implantation layer 105 can be formed. The device isolation region 110 can be formed, for example, by shallow trench isolation (STI).

According to an embodiment, it is possible to significantly increase the manufacturing yield of the back side illumination image sensor by easily and stably removing the back side of the substrate using the ion implantation layer 105 formed in advance, instead of removing the back side of the substrate by grinding.

Further, according to an embodiment, an ion implantation process of hydrogen or helium is performed to form the ion implantation layer 105, which is a cleaving layer, during the process using the epi wafer. Then, the first substrate 100 that is a donor wafer is bonded to the second substrate 200 that is a handle wafer after the process for the first substrate 100 is finished. After bonding, a cleaving process is performed to remove the lower part 100a of the first substrate. Since the first substrate 100 that is a donor wafer with the lower part removed is thin after bonding, the second substrate 200 is used as a handle wafer to smoothly progress subsequent processes such as a color filter process.

According to an embodiment, grinding and etch-back are not needed by using the ion implantation and cleaving, resulting in an advantage of not generating problems of the related art, such as an edge die fail and plasma damage.

Further, according to an embodiment, since grinding is not applied to the donor wafer, physical stress is not applied to the donor wafer, such that it is possible to inhibit damage to the light sensor and the readout circuit.

In yet another embodiment, as shown in FIG. 3C, it is possible to form the ion implantation layer 105 after forming the light sensor in the pixel region. The light sensor 120 may be a photodiode, but is not limited thereto. The light sensor 120 can be achieved by forming an N-type ion implantation region 120 on a P-type first substrate 100, and forming a Po region (not shown) on the N-type ion implantation region 120 of the first substrate, but it is not limited thereto. Extra electrons can be inhibited by the Po region. Further, according to an embodiment, it is possible to achieve charge dumping effect by forming the PNP junction.

Figure 4:
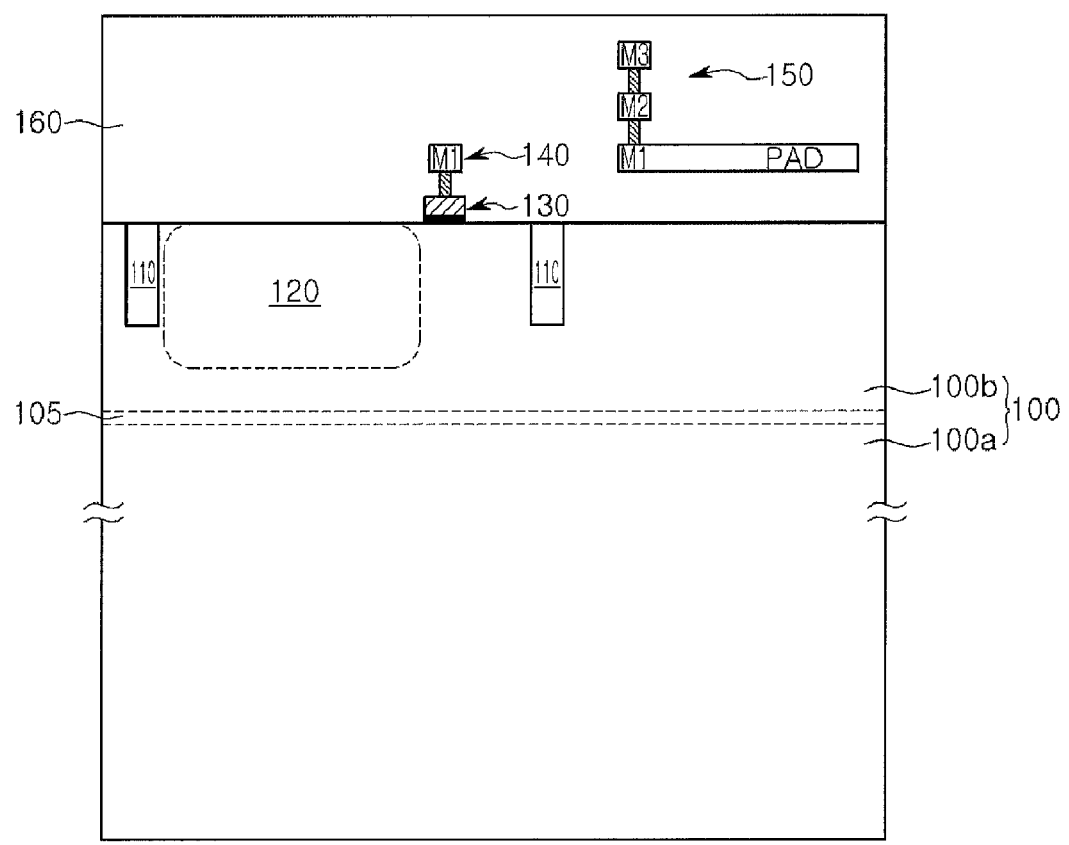

Next, as shown in FIG. 4, a readout circuit 130, which is a circuit device, is formed on the first substrate 100 where the light sensor 120 is formed. The readout circuit 130 may include a transfer transistor, a reset transistor, a drive transistor, and a select transistor, but is not limited thereto.

According to an embodiment, an epi wafer can be used as the first substrate 100, which is a donor wafer, and the light sensor 120 and the readout circuit 130 can be formed together with each other on the first substrate 100. Therefore, a bonding process of a 3D-image sensor which forms a light sensor over a circuit is not needed, such that the manufacturing is facilitated and problems relating to bonding and contacting are removed. Meanwhile, the handle wafer and the donor wafer are bonded with a dielectric layer, such as an interlayer dielectric layer, therebetween, resulting in fewer issues in bonding.

Further, according to an embodiment, it is possible to maximize the amount of incident light by minimizing the stack on the illumination part, and interference and reflection of light due to metal routing are removed, such that it is possible to optimize light characteristics of the image sensor.

Referring again to FIG. 4, an interlayer dielectric layer 160 and a metal line 140 are formed on the first substrate 100. The metal line 140 may include a first metal M1, and a second metal M2.

In addition, a pad metal line 150 can be on a logic region. The pad metal line 150 may include the first metal M1, a second metal M2, and a third metal M3 etc., but is not limited thereto. In this configuration, the pad can be formed at the same level as the first metal M1 of the metal line 140. Accordingly, a pad-open process can be easily applied to the back side of the first substrate 100 after the first substrate 100 is bonded with the second substrate 200. This is because the depth from the back side of the first substrate 100 to the pad is shallow.

Figure 5:
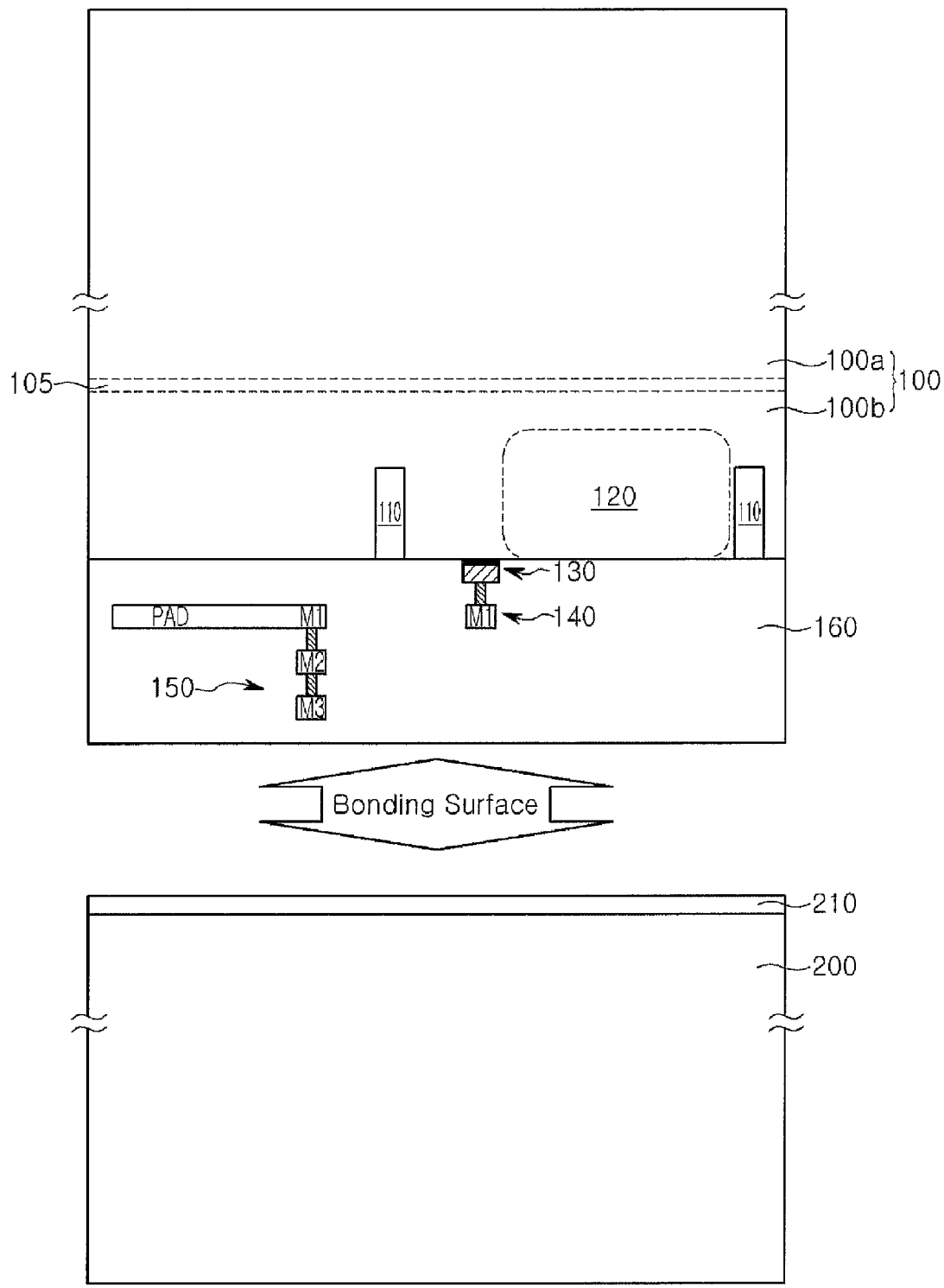

Next, as shown in FIG. 5, a second substrate 200 can be bonded with the front side of the first substrate 100 on which the metal line 140 is formed. For example, the second substrate 200 that is a handle wafer can be bonded to correspond to the metal line 140 of the first substrate 100.

According to an embodiment, it is possible to increase the bonding force with the first substrate by forming a dielectric layer on the upper surface of the second substrate 200 which is bonded with the first substrate 100. The dielectric layer 210 may be an oxide layer or a nitride layer, but is not limited thereto. Bonding is performed with the dielectric layer 210 contacting with the interlayer dielectric layer 160 which is the front side of the first substrate 100, such that the bonding force between the first substrate 100 and the second substrate 200 can be considerably increased.

Figure 6:
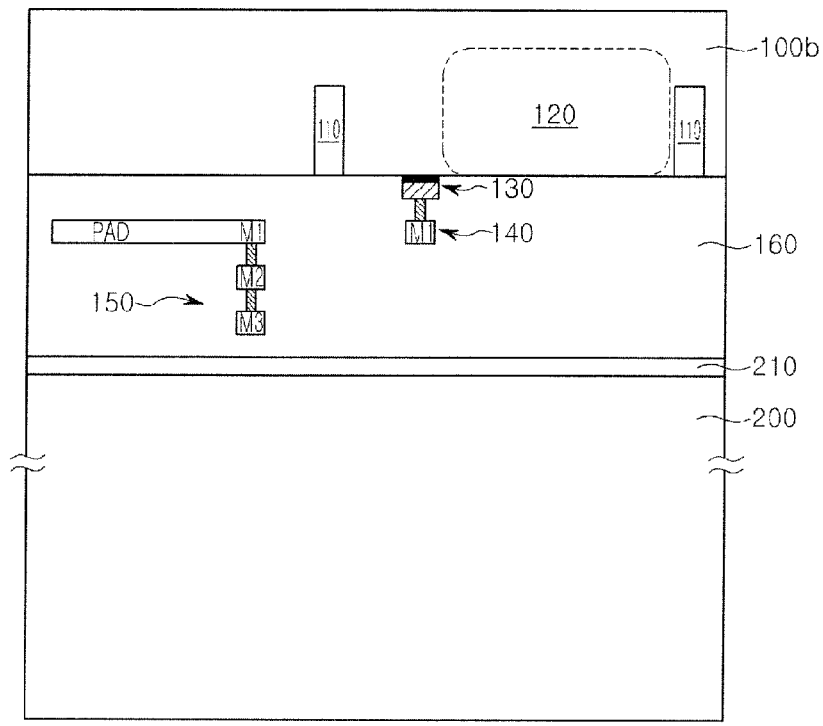

Next, in the first substrate 100 bonded as shown in FIG. 5, the lower part 100a of the first substrate defined by the ion implantation layer 105 is removed as shown in FIG. 6. For example, the upper part 100b of the first substrate can remain by bubbling the hydrogen ions by applying a heat treatment to the ion implantation layer 105 and cutting and removing the lower part 100a of the first substrate with a blade. Thereafter, planarization can be applied to the cut surface of the first substrate 100.

Meanwhile, in patents relating to a 3D-image sensor using a cleaving technology of the related art, in general, a light sensor and a readout circuit are formed at individual wafers and then bonding and interconnections are performed. According to the related art, the ion implantation of hydrogen or helium for forming a cleaving layer is often performed right before bonding.

However, according to the related art of the 3D-image sensor, it is difficult to completely electrically connect the readout circuit and the photodiode, and there is a problem that a short is generated in a metal line that is electrically connected with the photodiode.

In contrast, according to an embodiment, an epi wafer can be used as the first substrate 100, which is a donor wafer, and the light sensor 120 and the readout circuit 130 can be formed together on the first substrate 100. Therefore, a bonding process between a substrate with a light sensor and a substrate with a circuit, as in a 3D-image sensor that forms a light sensor over a circuit, is not needed. Accordingly, the manufacturing is easy and problems relating to bonding and contacting are removed.

Meanwhile, according to the 3D image sensor of the related art, hydrogen or helium ions can be implanted just before the bonding process. That is, electrons generated from the light sensor are transmitted to an electronic circuit device formed on a separate wafer and converted into voltage, and only the photodiode is formed on the donor wafer. Therefore, there is no need to form a metal layer and an interlayer dielectric layer on the related art donor wafer, such that it is possible to perform the ion implantation of hydrogen or helium right before bonding in the related art 3D-image sensor.

However, the light sensor 120 and the readout circuit 130 of embodiments of the present invention are on the same wafer, that is, the first substrate 100. Therefore, according to an embodiment, since the light sensor 120 and the readout circuit 130 are on the same first substrate 100, post-processes, such as forming the metal line 140 and the interlayer dielectric layer 160, are performed.

Therefore, according to the process scheme of an embodiment, the ion implantation using hydrogen or helium is not performed right before bonding. Rather, the ion implantation layer 105 is formed by performing ion implantation of hydrogen or helium before forming the metal line 140 and the interlayer dielectric layer 160 over the epi wafer of the first substrate 100.

Figure 7:
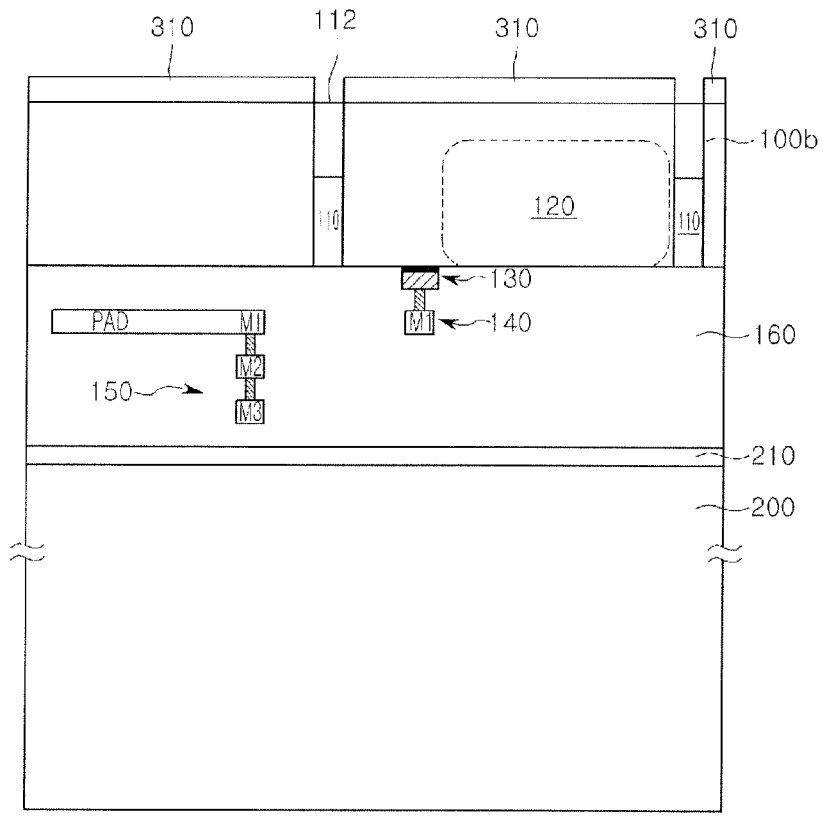

Next, referring to FIG. 7, a pixel isolating dielectric layer 112 is formed on the device isolation region 110 at the back side of the first substrate. For example, a trench (not shown) is formed on the back side of the first substrate on the upper part of the device isolating region. The trench can be formed by etching the back side of the wafer using a hard mask 310 as an etch mask. The hard mask 310 can be formed of an oxide layer and a nitride layer. The pixel isolating dielectric layer 112 may be formed by burying the trench.

According to an embodiment, the pixel isolating dielectric layer is on the back side of the first substrate by the Si etch to physically isolate between the light sensors, thereby making it possible to inhibit cross talk.

Figure 8:
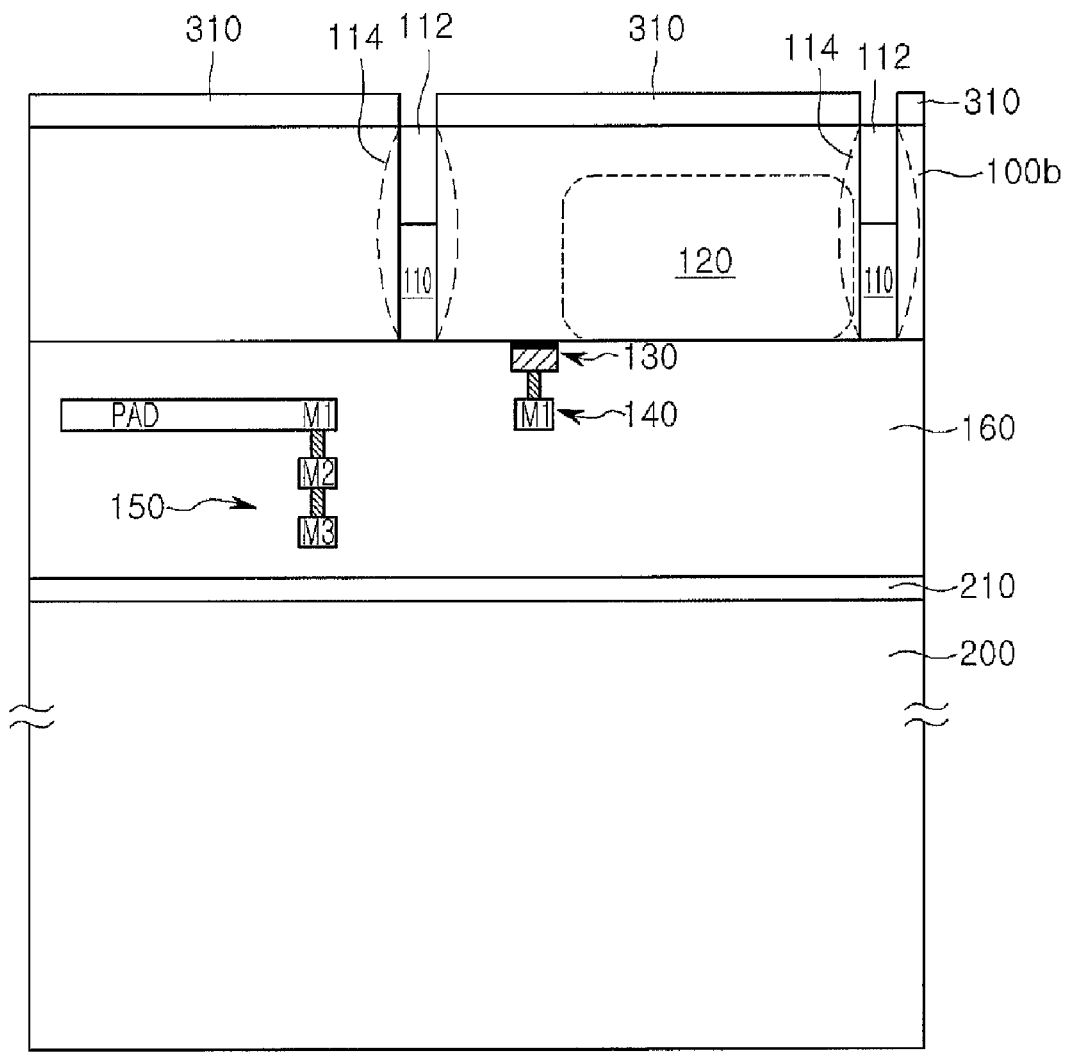

Referring to FIG. 8, a step of forming a pixel isolating ion implantation layer 114 can be performed. The pixel isolating ion implantation layer 114 can be formed in the back side of the first substrate 100 around the pixel isolating dielectric layer. At this time, the pixel isolating ion implantation layer 114 may also be formed on around the device isolation region 110. For example, the pixel isolating ion implantation layer 114 may be a high concentration P-type ion implantation region (P+).

For example, in order to form the pixel isolating ion implantation layer 114, the ion implantation is performed by P-type dopants, for example, B, BF, etc., using, as a self align mask, the state where the hard mask 310 used for the pixel isolating dielectric layer 112 remains, making it possible to form the high concentration P-type ion implantation region (P+). In one embodiment, the pixel isolating ion implantation layer 114 can be formed by implanting the P-type dopants into the back side of the first substrate 100 while using the hard mask 310 as an implantation mask. The implantation process can be performed at angles into the substrate. Although the pixel isolating ion implantation layer 114 is described as being formed after the pixel isolating dielectric layer 112 is formed, embodiments are not limited thereto. For example, the p-type dopants can be implanted before burying the pixel isolating dielectric in the trench at the back side of the first substrate or by implanting the p-type dopants into the back side of the substrate using the hard mask 310 before etching the substrate to form the trench.

According to an embodiment, the pixel isolating dielectric layer is formed on the back side of the substrate by an Si etching to physically isolate between the light sensors and P type pixel isolating ion implantation layers are then formed around sides of the pixel isolating dielectric layer and/or the device isolating region, thereby making it possible to inhibit cross talk.

Moreover, according to an embodiment, defects, which can occur due to the Si etch damage caused by forming the pixel isolating dielectric layer, are isolated using the P-type dopant of the pixel isolating ion implantation layer during the subsequent process, thereby making it possible to completely solve the cross-talk issue.

Further, an embodiment uses the fact that hard masks used to form the pixel isolating dielectric layer are self-aligned when the ion implantation process for forming the pixel isolating ion implantation layer is applied, thereby making it possible to apply the pixel isolating ion implantation layer without an additional mask process.

Figure 9:
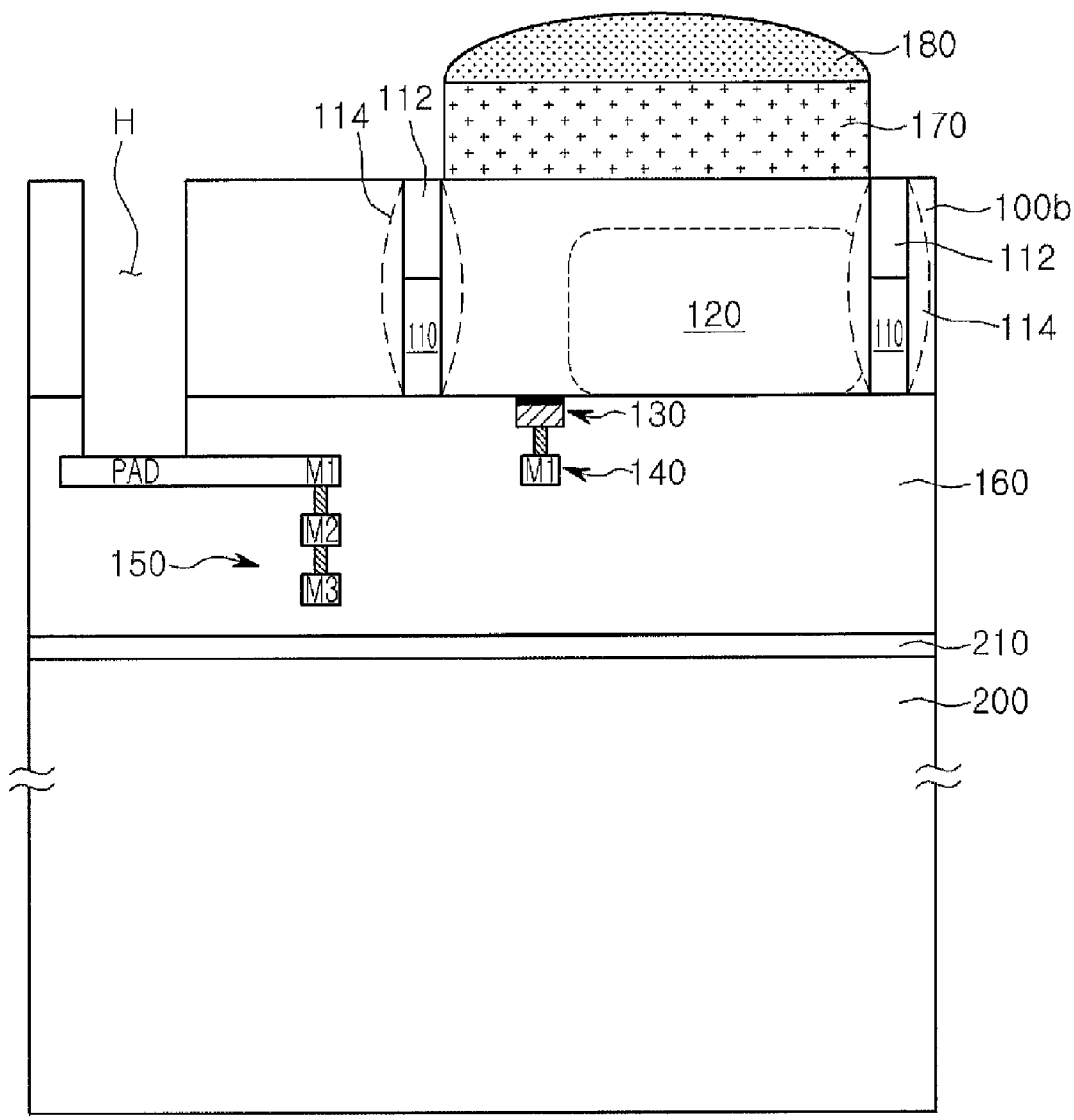

Next, as shown in FIG. 9, a color filter 170 may be formed on the light sensor 120 on the back side of the first substrate 100. For embodiments such as where the light sensor 120 is an R-G-B-vertical-stacked type photodiode, the color filter may be omitted.

Then, a microlens 180 can be formed on the color filter 170.

In addition, a process of opening the pad can be performed. The pad can be opened subsequent to the forming of the microlens. According to an embodiment, it is possible to apply a process of opening the pad to the back side of the first substrate 100. According to an embodiment, since the pad is formed at the level of the first metal M1, it is possible to easily open the pad from the back side of the first substrate 100.

According to the method of manufacturing a back side illumination image sensor of an embodiment, it is possible to stably and efficiently remove the back side of the substrate using an ion implantation technology. That is, according to an embodiment, grinding and etch-back are not needed by using the ion implantation and cleaving, resulting in an advantage of not generating problems of the related art, such as an edge die fail and plasma damage.

Further, according to an embodiment, the pixel isolating dielectric layer is formed on the back side of the substrate by an Si etching to physically isolate between the light sensors, and P type pixel isolating ion implantation layers are then formed around sides of the pixel isolating dielectric layer and/or the device isolating region, thereby making it possible to further inhibit cross talk.

Moreover, according to an embodiment, defects, which can occur due to the Si etch damage caused by forming the pixel isolating dielectric layer, are isolated using the P-type dopant of the pixel isolating ion implantation layer, thereby making it possible to further inhibit cross talk.

Further, an embodiment uses the fact that hard masks used to form the pixel isolating dielectric layer are self-aligned when the ion implantation process for forming the pixel isolating ion implantation layer is applied, thereby making it possible to apply the pixel isolating ion implantation layer without an additional mask process.

In addition, according to an embodiment, the pixel isolating ion implantation layer is formed on the pixel isolating dielectric layer that functions the device isolation region of the back side of the substrate to effectively inhibit the inter-pixel cross-talk, thereby making it possible to improve the image characteristics.

Further, according to an embodiment, since grinding is not applied to the donor wafer, it is possible to inhibit damage to the light sensor and the circuit device.

Further, according to an embodiment, the light sensor and the circuit device can be formed together on the epi wafer used as the donor wafer. Therefore, according to an embodiment, it is possible to considerably reduce the manufacturing cost by using the epi wafer, as compared with using an SOI wafer.

Further, according to an embodiment, an epi wafer can be used as a donor wafer and the light sensor and the circuit device can be formed together on the epi wafer. Therefore, a bonding process of a 3D-image sensor which forms a photodiode over a circuit is not needed, such that the manufacturing is easy and problems relating to bonding and contacting are removed. Meanwhile, the handle wafer and the donor wafer are bonded with a dielectric layer, such as an interlayer dielectric layer, therebetween, resulting in fewer issues in bonding.

Further, according to an embodiment, it is possible to maximize the amount of incident light by minimizing the stack on the illumination part, and interference and reflection of light due to metal routing are removed, such that it is possible to optimize light characteristics of the image sensor.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A back side illumination image sensor, comprising:
   a device isolation region and a pixel region on a front side of a first substrate;
   a light sensor and a readout circuit on the pixel region;
   an interlayer dielectric layer and a metal line on the front side of the first substrate;
   a second substrate that is bonded to the front side of the first substrate formed with the metal line;
   a pixel isolating dielectric layer on the device isolation region at a back side of the first substrate; and
   a microlens on the light sensor at the back side of the first substrate.

2. The back side illumination image sensor according to claim 1, further comprising pixel isolating ion implantation layers around sides of the pixel isolating dielectric layer.

3. The back side illumination image sensor according to claim 2, wherein the pixel isolating ion implantation layers are further around sides of the device isolation region.

4. The back side illumination image sensor according to claim 2, wherein the pixel isolating ion implantation layer is a P-type ion implantation region.

5. The back side illumination image sensor according to claim 1, further comprising a pad on the front side of the first substrate that is opened to the back side of the first substrate.

6. The back side illumination image sensor according to claim 1, further comprising a dielectric layer contacting the second substrate between the second substrate and the first substrate.

7. A method of manufacturing a back side illumination image sensor, comprising:
   forming an ion implantation layer by implanting ions over an entire front side of a first substrate;
   defining a pixel region by forming a device isolation region on the front side of the first substrate;
   forming a light sensor and a readout circuit on the pixel region;
   forming an interlayer dielectric layer and a metal line on the front side of the first substrate;
   bonding a second substrate with the front side of the first substrate formed with the metal line;
   removing a lower part of the first substrate based on the ion implantation layer;
   forming a pixel isolating dielectric layer on the device isolating region at a back side of the first substrate; and
   forming a microlens on the light sensor at the back side of the first substrate.

8. The method for manufacturing the back side illumination image sensor according to claim 7, further comprising forming pixel isolating ion implantation layers around sides of the pixel isolating dielectric layer.

9. The method for manufacturing the back side illumination image sensor according to claim 8, wherein the forming of the pixel isolating ion implantation layer further forms the pixel isolating ion implantation layers around sides of the device isolation region.

10. The method for manufacturing the back side illumination image sensor according to claim 8, wherein the forming of the pixel isolating ion implantation layer comprises implanting pixel isolating ions into the surface of the back side of the first substrate.

11. The method for manufacturing the back side illumination image sensor according to claim 8, wherein the forming of the pixel isolating ion implantation layers forms a P-type ion implantation region on the device isolation region.

12. The method for manufacturing the back side illumination image sensor according to claim 7, wherein the forming of the ion implantation layer is performed by implanting hydrogen ions or helium ions.

13. The method for manufacturing the back side illumination image sensor according to claim 7, wherein the forming of the ion implantation layer forms the ion implantation layer at a predetermined depth from the front side of the first substrate.

14. The method for manufacturing the back side illumination image sensor according to claim 7, wherein the removing of the lower part of the first substrate removes a portion of the first substrate at a side opposite to the front side of the first substrate based on the ion implantation layer.

15. The method for manufacturing the back side illumination image sensor according to claim 7, further comprising:
   forming a pad on the front side of the first substrate; and opening the pad after the removing the lower part of the first substrate based on the ion implantation layer.

16. The method for manufacturing the back side illumination image sensor according to claim 15, wherein the opening of the pad performs a pad opening process on the back side of the first substrate.

17. The method for manufacturing the back side illumination image sensor according to claim 7, further comprising:

forming a dielectric layer on the second substrate, wherein the dielectric layer contacts the front side of the first substrate in bonding the second substrate with the front side of the first substrate.

18. The method for manufacturing the back side illumination image sensor according to claim 7, wherein the ion implantation layer is formed before defining the pixel region.

19. The method for manufacturing the back side illumination image sensor according to claim 7, wherein the ion implantation layer is formed after forming the light sensor on the pixel region, wherein the readout circuit is formed after forming the ion implantation layer.

20. The method for manufacturing the back side illumination image sensor according to claim 7, wherein the ion implantation layer is formed before forming the light sensor.

* * * * *